United States Patent [19]
Walde et al.

[11] Patent Number: 6,005,218
[45] Date of Patent: Dec. 21, 1999

[54] PROCESS AND CIRCUIT FOR THE BIPOLAR PULSE-SHAPED FEEDING OF ENERGY INTO LOW-PRESSURE PLASMAS

[75] Inventors: Hendrik Walde, Fort Collins, Colo.; Jonathan Reschke, Dresden, Germany; Klaus Goedicke, Dresden, Germany; Torsten Winkler, Dresden, Germany; Volker Kirchhoff, Dresden, Germany; Peter Frach, Dresden, Germany

[73] Assignee: Fraunhofer-Gesellschaft zup Foerderung der angewandten Forschung e.V., Munich, Germany

[21] Appl. No.: 08/836,030

[22] PCT Filed: Oct. 19, 1995

[86] PCT No.: PCT/DE95/01473

§ 371 Date: Aug. 11, 1997

§ 102(e) Date: Aug. 11, 1997

[87] PCT Pub. No.: WO96/13964

PCT Pub. Date: May 9, 1996

[30] Foreign Application Priority Data

Oct. 27, 1994 [DE] Germany ............... 44 38 463

[51] Int. Cl.$^6$ .................................... B23K 10/00
[52] U.S. Cl. ............... 219/121.54; 219/121.57; 219/121.52
[58] Field of Search ............ 219/121.54, 121.57, 219/121.56, 121.59, 121.39, 121.44, 121.52

[56] References Cited

U.S. PATENT DOCUMENTS

| | | | |
|---|---|---|---|
| 3,917,992 | 11/1995 | Vladimirovich et al. ............ | 323/6 |
| 5,082,546 | 1/1992 | Szczyrbowski et al. . | |
| 5,393,954 | 2/1995 | Pasquini et al. ............ | 219/121.52 |
| 5,513,087 | 4/1996 | Kay ............ | 219/121.57 |

FOREIGN PATENT DOCUMENTS

| | | |
|---|---|---|
| 0 529 259 | 3/1993 | European Pat. Off. . |
| 0 534 068 | 3/1993 | European Pat. Off. . |
| 35 38 494 | 5/1987 | Germany . |
| 252 205 | 12/1987 | Germany . |
| 37 00 633 | 5/1988 | Germany . |
| 39 42 560 | 6/1991 | Germany . |
| 91 09 503 U | 11/1991 | Germany . |
| 40 42 287 | 7/1992 | Germany . |
| 41 06 770 | 9/1992 | Germany . |
| 41 27 317 | 2/1993 | Germany . |
| 41 27 504 | 2/1993 | Germany . |

(List continued on next page.)

OTHER PUBLICATIONS

*Dunne Schichten* 1992, entitled Mit bipolarem Pulsplasma in eine neue Plasmaaera by Günter Mark, Thomas Linz, pp. 13–15.

*Primary Examiner*—Mark H. Paschall
*Attorney, Agent, or Firm*—Evenson, McKeown, Edwards & Lenahan, P.L.L.C.

[57] ABSTRACT

A process and circuit for the bipolar pulse-shaped feeding of energy into low-pressure plasmas is provided. Within an average time period, a power which is to be as high as possible is to be fed into the low pressure discharge. In each polarization, the same power is to be fed although the impedance differs considerably. In a system for plasma and surface treatment techniques having at least two electrodes and one power supply, the outputs of at least two potential-free direct current supplies are switched such that an output of one direct current supply is conductively connected with an output of the same polarity of the other direct current supply. By means of a switch which is connected with each feed line to the electrodes and whose other outputs are led in a combined manner to the other outputs of the direct current source, these switches are operated via a timing generator in synchronism with the pole changing frequency. The switches are opened up in the event of the occurrence of an arcing. The process is used for the bipolar pulse sputtering for depositing electrically insulating layers on workpieces. Preferably, such layers are used for a mechanical protection, protection against wear and the improvement of sliding characteristics.

10 Claims, 5 Drawing Sheets

FOREIGN PATENT DOCUMENTS

| | | |
|---|---|---|
| 41 27 505 | 2/1993 | Germany . |
| 41 36 655 | 5/1993 | Germany . |
| 42 02 425 | 8/1993 | Germany . |
| 42 30 779 | 3/1994 | Germany . |
| 42 39 218 | 5/1994 | Germany . |
| 43 24 683 | 11/1994 | Germany . |
| 364554 | 11/1962 | Switzerland . |

PROCESS AND CIRCUIT FOR THE BIPOLAR PULSE-SHAPED FEEDING OF ENERGY INTO LOW-PRESSURE PLASMAS

BACKGROUND AND SUMMARY OF THE INVENTION

The invention relates to a process for the bipolar pulse-shaped feeding of energy into an electric low-pressure discharge as well as to the pertaining circuit for implementing the process. It is preferably used in systems and apparatuses of plasma and surface treatment technology which operate with pole changing frequencies of up to 200 kHz. A typical application is the process of reactive bipolar pulse sputtering for depositing electrically insulating thin layers on workpieces; for example, for the purpose of providing a mechanical protection, the reduction of wear or the improvement of sliding characteristics.

It is known to operate low-pressure discharges with a high frequency of 1 MHz to 100 MHz (German Patent document DE 39 42 560 A1). A disadvantage of using such high frequencies is that they present great technical difficulties in coupling the high frequency onto large surfaces (electrodes), and the coating rate is lower by a factor of from 10 to 100 than using frequencies in the kHz range.

It is known to operate electric low-pressure discharges in a bipolar manner by means of a pole change frequency of up to 100 kHz. When such discharges, for example, by means of two magnetron sources, are used for reactive sputtering, the required stability of the discharge can also be reached in this manner when electrically highly insulating layers are deposited. By cyclically changing the polarity, the discharge of surfaces is caused. The surfaces are completely or partially covered with insulating layers and are connected with the plasma when the pole changing frequency is sufficiently high (German Patent Documents DD 252 205 A1; DE 40 42 287; DE 41 06 770 A1).

From the above references, it is also known to feed energy into such discharges by means of alternating-current generators, particularly sine wave generators. This form of energy feeding has the following significant disadvantages. (1) It is very difficult or even impossible to feed the same power at both polarities because the impedance of the electric low-pressure discharge is unequal in the two pole directions. This is particularly true when, for example, the electrodes are formed by sputtering cathodes made of a different material or are covered with oxides in a different manner. As a result, the stable operation of the discharge at an operating point required for implementing the plasma process is impossible. (2) Furthermore, by means of sine wave generators, it is not possible to feed a predetermined ratio of the power for both pole directions, as required, for example, for magnetron sources with several galvanically separated electrodes.

It was suggested to control the feeding time of the energy as the operating time for the glow process for the generator during the positive and/or negative half-wave such that no energy is fed at least for the period of time of the half-wave (German Patent document P 43 24 683.4). This process for adapting the sine wave generator was tested only in the lab operation and has not yet been used. One disadvantage when feeding the discharge by means of a sine wave generator is the occurrence of arcing. It is not possible to lower the residual energy of the pertaining transformer or oscillating circuit, which is unintentionally converted in such an arcing, below a specific value.

Furthermore, a circuit is known which improves the switch-off action (German Patent document DE 41 27 505). However, its expenditures are too high in the required frequency range. The main disadvantage during the feeding of a low-pressure gas discharge by means of a sine wave generator is the considerable increase of the impedance of the gas discharge during each pole change which, on the whole, results in a faulty adaptation of the generator. In addition to a deterioration of the efficiency, this leads to high discharge voltages with the known danger of spark-overs.

It is also known to feed low-pressure gas discharges by means of bipolar rectangular pulse generators (European Patent document EP 0 534 068 A2; *Thin Layers*, Volume 4/1992, Pages 13–15). This permits the adaptation of the generator to the polarity-dependent different impedance. A given power ratio for both polarizations can also be adjusted by the dimensioning of the so-called "pulse-off" and "pulse-on" time. The circuit-caused equality of the pulse voltage for both polarizations is a disadvantage. Furthermore, as the result of limits of the technical parameters of the switching circuit elements, an upper frequency limit occurs for the pole change. Currently, frequencies above 50 kHz cannot be reached. Another significant disadvantage is the low value of the energy which can be fed into the plasma in an average time period. The cause is the limited current rising rate which can be observed after each pole change. Because this circuit has the characteristic of a pulsed voltage source, it, on the other hand, has advantageous self-stabilizing characteristics.

In addition, for the unipolar energy feeding in low-pressure gas discharges, in addition to devices for switching off the energy with a very low time constant when arcing occurs, processes are also known for the unipolar, pulse-shaped feeding of the energy by means of so-called chopper circuits (see German Patent documents 41 27 317, DE 37 00 633; DE 41 36 665; DE 42 02 425; DE 41 27 504; DE 42 39 218 A1; DE 42 30 779 Al) Partly, the periodic short-circuiting of the gas discharge is suggested for the purpose of discharging surfaces which are in contact with the plasma. However, all these solutions are not suitable for the bipolar feeding of the energy in accordance with the invention.

A device for generating low-pressure plasmas is also known into which the energy is fed in a bipolar pulse-shaped manner. The pole changing frequency amounts to less than 200 kHz. The device consists of a controllable direct current (DC) power supply with a bridge circuit. The output of the bridge circuit is connected with a current detection circuit (German Patent document DE-G 91 09 503 U1). This device operates by means of only one voltage source independently of the number of electrodes making up the device. This device has the disadvantage that it is not possible by means of it to feed the same powers in the case of each polarization if the impedances of the gas discharges are considerably different.

The invention is based on the object of providing an improved process and a pertaining circuit for the bipolar pulse-shaped feeding of energy with pole change frequencies of up to 200 kHz in low-pressure discharges. In an average time period, a power which is as high as possible is to be fed into the low-pressure discharge. The same power is to be fed into each polarization although the impedance of the gas discharge differs considerably in the two polarizations.

According to the invention, the object is achieved by a circuit for the bipolar pulse-shaped feeding of energy into low pressure plasmas with a pole changing frequency of up to 200 kHz for systems of the plasma and surface treatment technology having at least two electrodes ($E_1$ to $E_n$) which are in contact with the plasma, a current supply, an inductance ($L_1$ to $L_n$) and at least one switch ($S_1$ to $S_n$). One group of outputs of the same polarity of at least two potential-free direct current supplies, consisting of direct voltage sources ($DC_1$ to $DC_n$) and inductances ($L_1$ to $L_n$) connected in series with the latter, are electrically conductively connected with a same number of electrodes ($E_1$ to $E_n$) of a plasma device with a low pressure discharge. The respective other outputs of the direct current supplies are connected with one another. Between the resulting common pole and the connection lines of the electrodes ($E_1$ to $E_n$) with the one group of outputs of the direct current supplies, one switch ($S_1$ to $S_n$) respectively is arranged which has a common timing generator (T) for the pole change and a common trigger (A) for the switching in the case of the occurrence of an arcing. The inductances ($L_1$ to $L_n$) are dimensioned such that the entire energy supplied by the respective assigned direct voltage source ($DC_1$ to $DC_n$) can be taken up in the time interval between two pole changes. Additional advantageous further developments are also described herein. The circuit for implementing the process is further described.

A decisive advantage of the process according to the invention consists of the characteristic of the unexpectedly high current rising rate after each pole change coupled with a stable defined line feeding in each pole direction. It is obviously based on the effect of the energy accumulators divided in the form of the inductances $L_1 \ldots L_n$ and their influence on the dynamic behavior of the plasma impedance after each pole change. This effect is disclosed in a comparison of the process according to the invention with a process which is obvious to a person skilled in the art according to the state of the art and which uses the circuit illustrated in FIG. 1 (German Patent document DE 35 38 494 A1). In this circuit, a direct voltage source DC is connected by way of an inductance L with a switch S. The switch S acts as a pole changing circuit which is known per se and to which the electrodes $E_1$ and $E_2$ of a low-pressure discharge are connected. This circuit has the character of a bipolar pulsed current source. The high current rising rate which can be achieved by means of it is very advantageous. However, it does not provide a possibility for the controlled power feeding in the case of a polarization-dependent different impedance of the discharge. The effect that the polarization-dependent differences of the impedance are critically increased which is observed, for example, in the case of the bipolar reactive sputtering of aluminum oxide, is particularly critical.

In contrast, the process according to the invention represents a pulse-shaped feeding of energy with a characteristic which, viewed over one pulse period, is that of a current source and thus permits a very high current rising rate. However, when viewed for the duration of several pulse periods, it acts as a voltage source and therefore has self-stabilizing characteristics in the above-described sense. By means of this process, the power for each polarization can be adjusted, even at a different impedance of the low-pressure discharge of the two polarizations to a given value in that the power of each of the direct voltage sources is given independently of the other.

Advantageously, in the case of the process according to the invention, the switching operations on the switches are in each case triggered simultaneously. However, it may also be expedient to close the switches for a fraction of the pulse length and thus short-circuit the low-pressure discharge. In addition, this switching condition exists during the occurrence of an arcing if a pole change is not carried out immediately. However, the simultaneous opening of the switches is not expedient.

When, for reasons of carrying out the process, a pulse length is set which is unequal for the two polarizations, that is, an unequal opening duration of the switches, the dimensioning of the direct voltage sources must take this condition into account. When two direct voltage sources are used, the voltage of one is increased by as much as the other is decreased.

A particularly precise, polarization-dependent feeding of the power into the low-pressure discharge is achieved when the power for the two polarizations is measured separately and is utilized as an actual value of at least one controlled system.

The dimensioning of the inductances must ensure that the entire energy of the assigned direct voltage source supplied in the time between two pulse changes is taken up. However, it is expedient to dimension the inductances larger in order to reduce the energy load of the switches. The dimensioning of the inductances also influences the time sequence of the current fed into the low pressure discharge. As a result, the form of the resulting current curve can be adapted to the requirements of the plasma process or the surface treatment process.

The invention will be explained in detail on several embodiments.

DETAILED DESCRIPTION OF THE DRAWINGS

Figure 2:
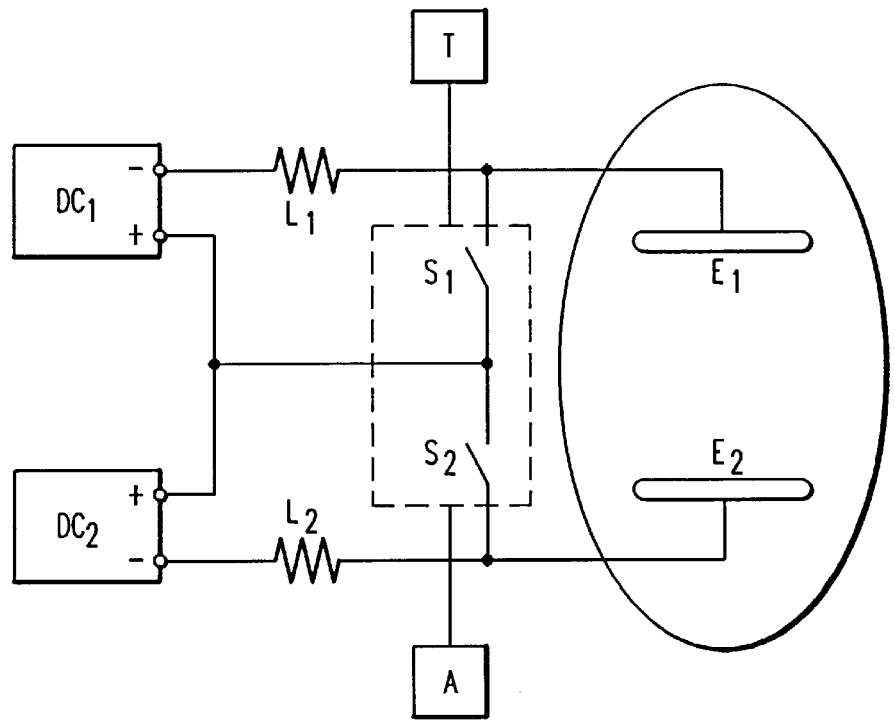
FIG. 2 is a view of a basic circuit for implementing the process according to the invention.

In FIG. 2, the outputs of two direct voltages sources $DC_1$ and $DC_2$ are connected by way of inductances $L_1$ and $L_2$ with the electrodes $E_1$ and $E_2$ which are surfaces of the low pressure discharge. Between the inductance $L_1$, $L_2$ and the electrode $E_1$, $E_2$, each line is connected with a switch $S_1$, $S_2$. The other poles of the switches $S_1$; $S_2$ are interconnected and coupled with the other outputs of the direct voltage source $DC_1$ and $DC_2$. A timing generator T connected with a switch $S_1$ provides the pole change and the trigger A connected with the switch $S_2$ causes the switching-off when an arcing occurs.

Figure 3A:
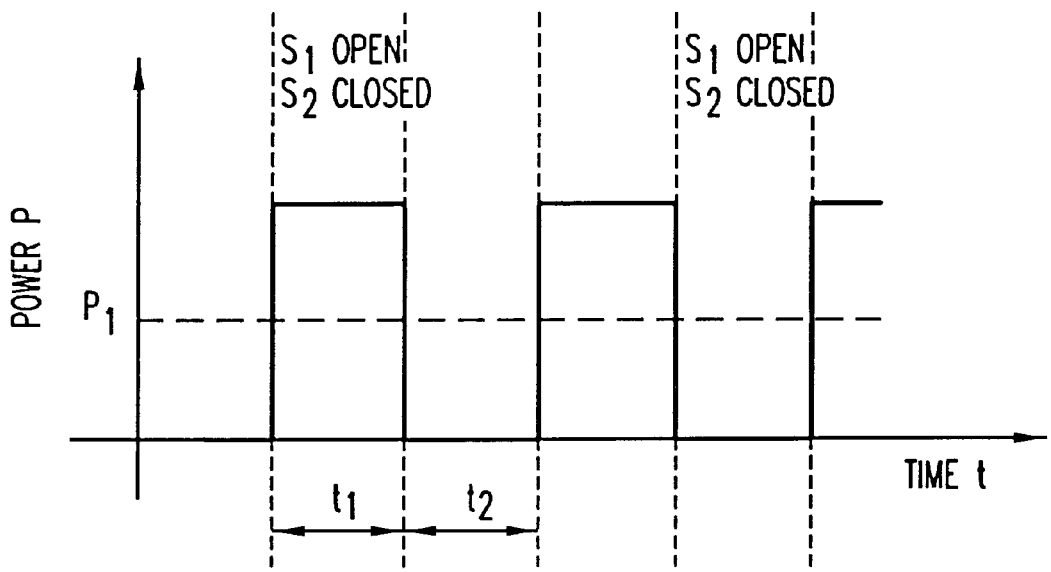
FIG. 3 is a representation of the power input into the low pressure discharge.
Figure 3B:
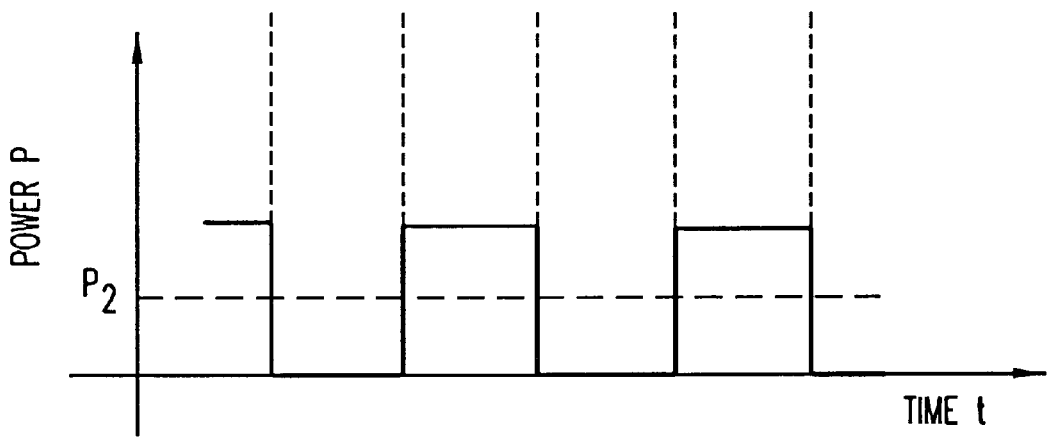

FIG. 3 is a schematic representation of the power input into the low pressure discharge for each of the two polarizations when the timing generator T is operative and the opening and closing times for the two polarizations coincide. $P_1$ is the power emitted by the direct voltage source $DC_1$ during the average time; $P_2$ is the power correspondingly emitted by the direct voltage source $DC_2$.

In phase $t_1$, an energy is fed into the low pressure discharge which is composed of the energy part emitted in this phase by the direct voltage source $DC_1$ and an energy part stored in the inductance $L_1$. In this phase, the direct voltage source $DC_2$ supplies energy which is stored in the inductance $L_2$.

After the pole change, in phase $t_2$, the low pressure discharge is connected with the direct voltage source $DC_2$ and the inductance $L_2$. Energy is now fed into the discharge which consists of a part originating from the direct voltage source $DC_2$ and the energy part stored in phase $t_1$ in the inductance $L_2$. In the ideal limit case, a power can be fed into the discharge between the electrodes $E_1$ and $E_2$ which corresponds to the sum of the powers of the two direct voltage sources $DC_1$ and $DC_2$.

The direct voltage sources DC are known, expediently power-controlled direct voltage generators. In special cases, the use of current-controlled or voltage-controlled direct voltage generators is expedient. Which type of control of the direct voltage generators is advantageous is decided by means of the current-voltage characteristic of the low pressure discharge mainly in the reactive operating mode.

For the inductances L, inductance coils should expediently be selected whose ohmic resistance is small with respect to that of the low pressure discharge in the endeavored operating point. The construction of the coils must avoid a magnetic coupling. The switches 5 are preferably constructed as semiconductor switches, such as bipolar transistors, insulated gate bipolar transistors (IGBT) or field effect transistors (FET). They are equipped with known circuits for protection against excess voltage and excess current. Likewise, turn-on and turn-off relief networks are used. Furthermore, it is expedient to use damping networks against plasma oscillations whose frequency is higher than the pulse frequency.

Figure 4:
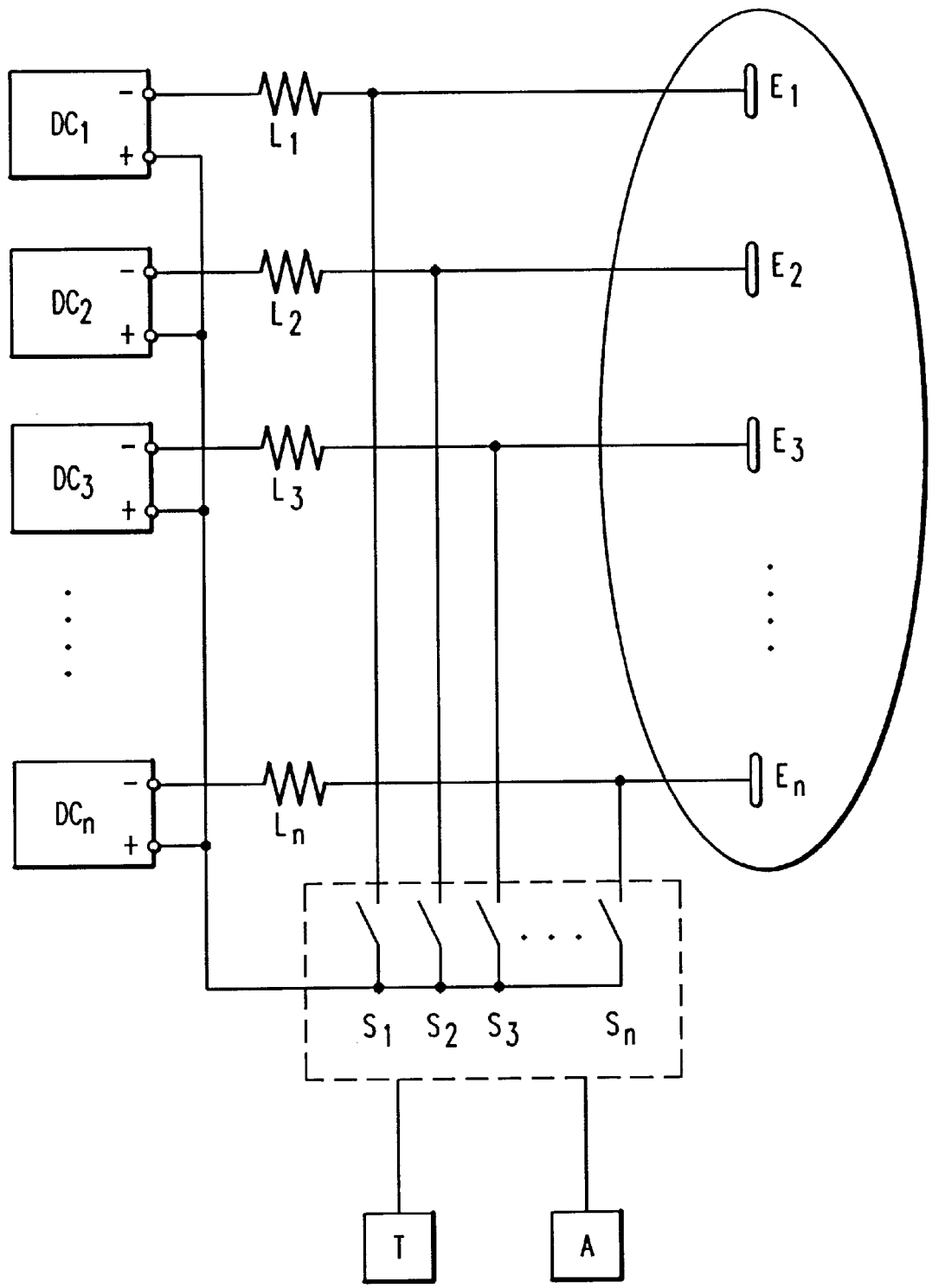
FIG. 4 is a view of a circuit having several electrodes and direct voltages sources.

Another construction of the circuit is illustrated in FIG. 4. In the case of this circuit, the low pressure discharge takes place with more than two electrodes. Several direct voltage sources $DC_1$ to $DC_n$ are used for several electrodes $E_1$ to $E_n$ which are connected with the plasma. For this purpose, switches $S_1$ to $S_n$ and inductances $L_l$ to $L_n$ are interconnected. The operation of the lower pressure discharge takes place by a bipolar feeding of energy into several bipolar-operated discharge systems between, in each case, at least two of the electrodes E. The timing generator T has the effect that the switches S in a timed manner are operated such that, in each pulse, at least one of the switches S is opened and at least one of the switches S is closed, and that, during the pole change, the current direction is reversed on at least one electrode E. The further development takes place analogously to the construction according to FIG. 2.

Figure 5:
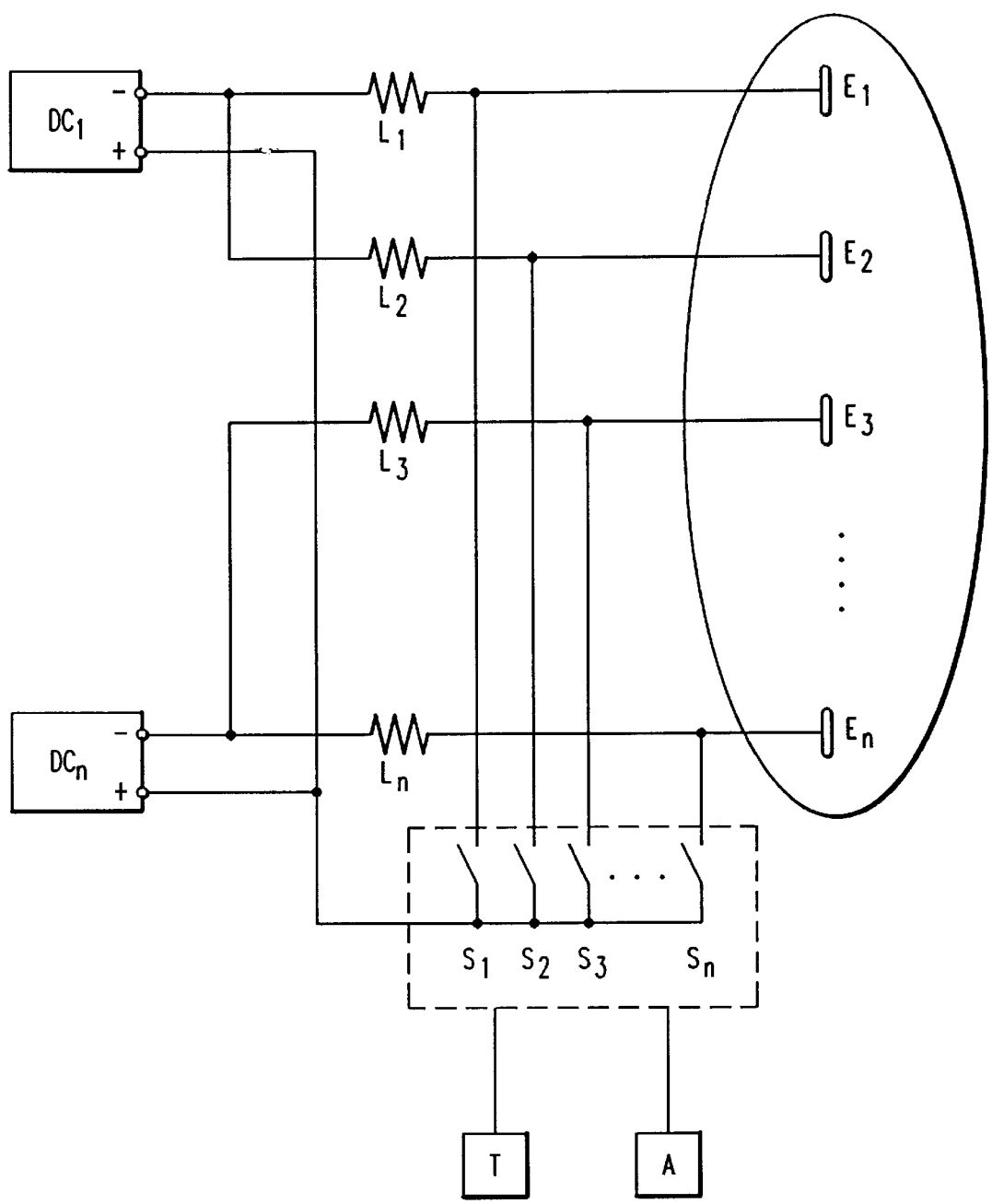
FIG. 5 is a view of the circuit having several electrodes and combined direct voltage sources.
Figure 6:
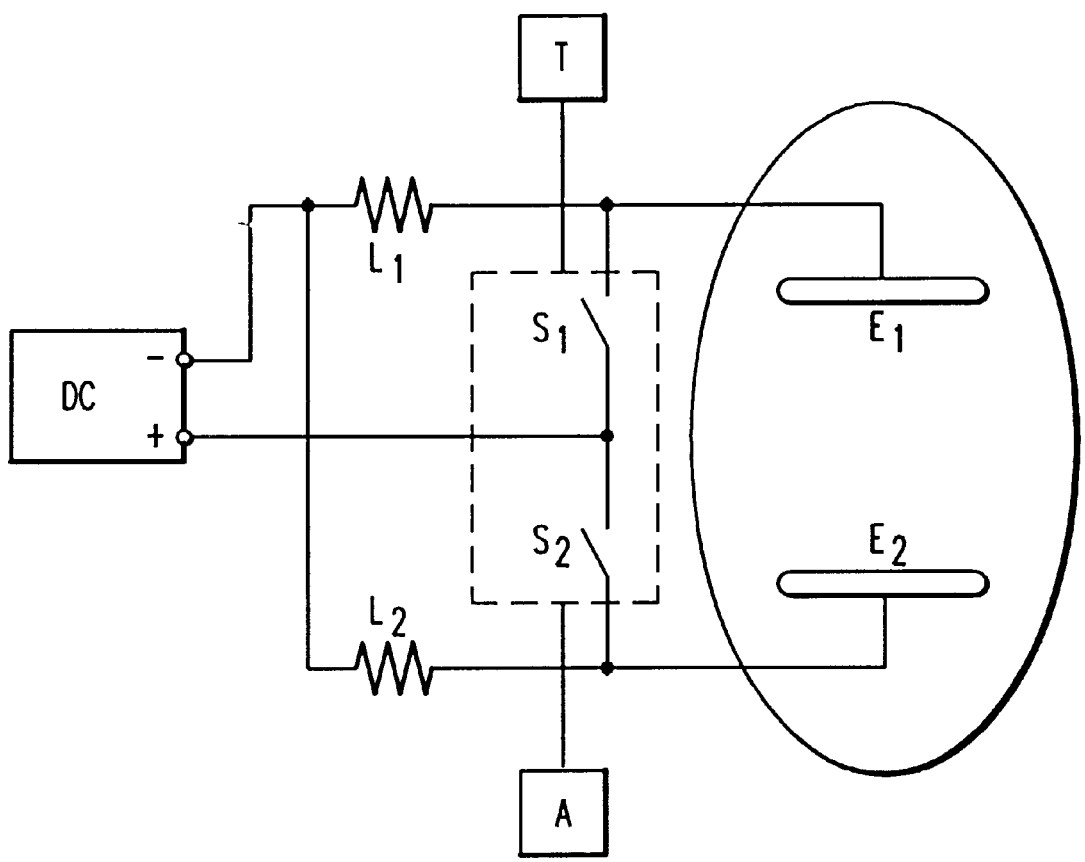
FIG. 6 is a view of a circuit having two electrodes and one direct voltage source.

When several of the direct voltage sources DC in the device according to FIG. 4 are operated with the same voltage, these, or any number of these, may also be combined into a common voltage source. FIG. 5 illustrates the corresponding basic circuit diagram. Another variant is shown in FIG. 6. In this case, a device is operated with two electrodes $E_1$, $E_2$. The two direct current supplies required for this purpose consist of two direct voltage sources which are combined or interconnected to form a single direct voltage source, and the two inductances $L_1$, $L_2$ connected in series thereto. As indicated above, for this case, the voltage is the same for the operation of the low pressure glow discharge in both polarizations.

According to the circuit illustrated in FIG. 2, the process according to the invention is carried out as follows. The energy is fed in a bipolar manner into the electrodes E of a plasma system; that is, a vacuum coating system, which is used for the application of aluminum oxide protective layers on small components by reactive magnetron sputtering. The vacuum coating system contains receiving devices for the workpieces as well as two magnetron sputtering sources whose targets form the electrodes E of the low pressure discharge. The targets consist of aluminum and are sputtered in an argon oxygen gas mixture. By means of the bipolar-pulsed energy feeding, these electrodes act alternately in a timed manner of the pulse changing frequency as a cathode or anode of the discharge. A pulse changing frequency of 70 kHz is selected in order to avoid arcing phenomena on the electrodes and to ensure a stable operation of the low pressure discharge.

Figure 1:
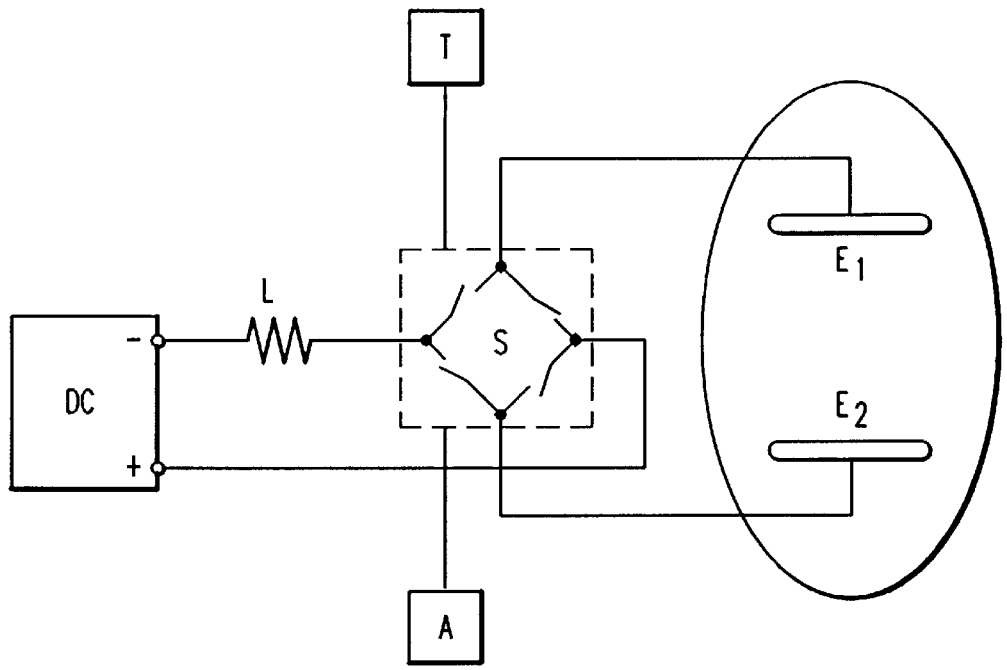
FIG. 1 is a view of a circuit according to the state of the art.

In an average time period, an amount of power must be fed into the low pressure discharge which is as high as possible. In each polarization, the same power is to be fed although the impedance of the gas discharge differs considerably in the two polarizations. This is the result of a differing covering of the target with insulating oxide layers. The demand for the same power in each polarization is a result of the fact that a stable operating point of the reactive sputtering process can be set only in this manner. In addition to the circuit elements illustrated in FIG. 1, the vacuum coating system also contains protection circuits against excess voltage/excess current, relief networks for the turn-on/turn-off operation and damping networks for high-frequency oscillations which are triggered in the plasma. The switches $S_1$, $S_2$ are formed by highly-loadable IGBT's. The endeavored total power of an average of 35 kW is fed by means of two direct voltage generators of a normal power of 20 kW respectively. By means of the inductances $L_1$ and $L_2$, the direct voltage generators operate as direct voltage sources $DC_1$, $DC_2$. The inductances L are individually constructed medium frequency inductors with an inductance of $500\mu$ Henry at a current carrying capacity of 75 A which do not influence one another. The ohmic internal resistance is 12 mOhm. During a polarization change, the current rises from 5 $\mu$s to 60 A. Depending on the polarization, the voltage drop between the electrodes $E_1$ and $E_2$ is an average of 560 V and 640 V. The ignition action during the pole change is very good because peak voltages of almost 1,000 V occur and the pole change takes place so fast that a high median plasma density is maintained. At the direct voltage sources $DC_1$, $DC_2$, a voltage of 280 V and 320 V is measured. The difference with respect to the discharge voltage results from the energy accumulator effect of the inductors. The change of the momentary values of the currents in the two polarizations of the pulse amounts to 12.8 A and 11.2 A so that a current ripple of under 20% is ensured. The high current rising rate has the effect that the entering of the high bipolar power into the discharge of 35 kW is possible. The equality of the power in both polarizations and the limiting of the current ripple permit a stable operating point of the reactive sputtering process in the case of a constant flow of the argon oxygen gas mixture. The method according to the invention of the feeding of energy is the key to an increase of the coating rate by a factor of 3 in comparison to the state of the art.

We claim:

1. A circuit for bipolar pulse-shaped feeding of energy into low pressure plasmas with a pole changing frequency of up to 200 kHz for systems of plasma and surface treatment technology using at least two electrodes in contact with a plasma, a current supply, an inductance and at least one switch, the circuit comprising:

one group of outputs of a same polarity of at least two potential-free direct current supplies comprising direct voltage sources and inductances connected in series with one another, are electrically conductively connected with a same number of electrodes of a plasma device with a low pressure discharge;

other outputs of said direct current supplies being connected with one another to form a common pole;

between said common pole and connection lines which connect said electrodes with said one group of outputs of the direct current supplies, one switch is respectively arranged having a common timing generator for a pole change and a common trigger for a switching upon an occurrence of arcing;

wherein said inductances are dimensioned such that an energy supplied by a respectively assigned direct voltage source is accumulated in a time interval between two of said pole changes.

2. The circuit according to claim 1, wherein several direct voltage sources of several direct current supplies are interconnected to form a common direct voltage source connected in each case by way of several inductances corresponding to the number of electrodes.

3. The circuit according to claim 1, wherein said electrodes are cathodes of a magnetron discharge.

4. The circuit according to claim 2, wherein said electrodes are cathodes of a magnetron discharge.

5. A process for bipolar pulse-shaped feeding of energy into a low pressure plasma using a circuit in which one group of outputs of a same polarity of at least two potential-free direct current supplies comprising direct voltage sources and inductances connected in series with said direct current supplies are electrically conductively connected with the same number of electrodes of a plasma device with a low pressure discharge, and respective other outputs of said direct current supplies are connected with one another to form a common pole between which common pole and connection lines of said electrodes with said one group of outputs of the direct current supplies one switch is respectively arranged having a common timing generator for a pole change and a common trigger for a switching upon an occurrence of arcing, the process comprising the steps of:

always maintaining at least one switch opened and at least one switch closed;

when more than two electrodes are used, closing one switch while maintaining said other switches opened;

in synchronism with said pole changing frequency, closing an adjacent switch while said previously closed switch is opened;

when an arcing is recognized, closing a respective open switch connected with an arcing electrode with a time delay of less than one microsecond to a maximum point in time of a next pole change or alternatively carrying out a pole change with said time delay.

6. The process according to claim 5, predetermining a power fed into the low pressure plasma for each of the polarizations by an indication of powers of respective direct voltage sources.

7. The process according to claim 5, further comprising the step of predetermining a power fed into the low pressure plasma for each of the polarizations by an indication of a pulse length for each polarization.

8. The process according to claim 5, further comprising the step of separately measuring the fed power for both polarizations and utilizing said fed power as an actual value of at least one controlled system.

9. The process according to claim 6, further comprising the step of separately measuring the fed power for both polarizations and utilizing said fed power as an actual value of at least one controlled system.

10. The process according to claim 7, further comprising the step of separately measuring the fed power for both polarizations and utilizing said fed power as an actual value of at least one controlled system.

* * * * *